(12) United States Patent
Ito et al.

(10) Patent No.: US 10,741,470 B2
(45) Date of Patent: *Aug. 11, 2020

(54) HEAT CONDUCTIVE SHEET AND METHOD OF PRODUCING SAME, AND HEAT DISSIPATION DEVICE

(71) Applicant: ZEON CORPORATION, Chiyoda-ku, Tokyo (JP)

(72) Inventors: Toyokazu Ito, Tokyo (JP); Hiromi Kitagawa, Tokyo (JP); Gen Kobayashi, Tokyo (JP)

(73) Assignee: ZEON CORPORATION, Chiyoda-ku Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/078,237

(22) PCT Filed: Feb. 17, 2017

(86) PCT No.: PCT/JP2017/006014
§ 371 (c)(1),
(2) Date: Aug. 21, 2018

(87) PCT Pub. No.: WO2017/145957
PCT Pub. Date: Aug. 31, 2017

(65) Prior Publication Data
US 2019/0244875 A1     Aug. 8, 2019

(30) Foreign Application Priority Data

Feb. 25, 2016 (JP) .................................. 2016-034817

(51) Int. Cl.
C08L 27/12 (2006.01)
C08K 3/04 (2006.01)
(Continued)

(52) U.S. Cl.
CPC .......... *H01L 23/3737* (2013.01); *B32B 27/08* (2013.01); *C08K 3/04* (2013.01);
(Continued)

(58) Field of Classification Search
None
See application file for complete search history.

(56) References Cited

U.S. PATENT DOCUMENTS

2004/0054029 A1* 3/2004 Fujiki .................. H05K 9/0083
523/137
2008/0153986 A1* 6/2008 Maeda .................... C08L 27/12
525/101
(Continued)

FOREIGN PATENT DOCUMENTS

EP         2583993 A1    4/2013
JP     2006137930 A      6/2006
(Continued)

OTHER PUBLICATIONS

May 16, 2017, International Search Report issued in the International Patent Application No. PCT/JP2017/006014.
(Continued)

*Primary Examiner* — Richard A Huhn
(74) *Attorney, Agent, or Firm* — Kenja IP Law PC

(57) ABSTRACT

Disclosed are a heat conductive sheet including a resin and a particulate carbon material, and having a thermal resistance value under a pressure of 0.05 MPa of 0.20° C./W or less, a heat dissipation device including the heat conductive sheet interposed between a heat source and a heat radiator, and a method of producing a heat conductive sheet.

5 Claims, 7 Drawing Sheets

(51) Int. Cl.
*H01L 23/373* (2006.01)
*H01L 23/36* (2006.01)
*B32B 27/08* (2006.01)
*H05K 7/20* (2006.01)
*C08L 101/00* (2006.01)
*H01L 23/367* (2006.01)
*C08L 27/16* (2006.01)
*C08L 27/18* (2006.01)
*C08L 27/14* (2006.01)
*C08L 27/20* (2006.01)

(52) U.S. Cl.
CPC ............ *C08K 3/041* (2017.05); *C08L 101/00* (2013.01); *H01L 23/36* (2013.01); *H01L 23/367* (2013.01); *H01L 23/373* (2013.01); *H05K 7/20* (2013.01); *H05K 7/20481* (2013.01); *C08K 3/046* (2017.05); *C08L 27/12* (2013.01); *C08L 27/14* (2013.01); *C08L 27/16* (2013.01); *C08L 27/18* (2013.01); *C08L 27/20* (2013.01); *C08L 2205/02* (2013.01); *C08L 2205/025* (2013.01); *C08L 2666/55* (2013.01)

(56) References Cited

U.S. PATENT DOCUMENTS

| 2008/0318049 | A1 | 12/2008 | Hata et al. |
| 2011/0061852 | A1 | 3/2011 | Tashiro et al. |
| 2011/0300388 | A1* | 12/2011 | Yokota ................ B29C 45/0005 428/422 |
| 2015/0166771 | A1 | 6/2015 | Aramaki et al. |
| 2017/0066955 | A1* | 3/2017 | Chen ........................ C09K 5/14 |

FOREIGN PATENT DOCUMENTS

| JP | 2010132856 A | | 6/2010 |
| JP | 2011162642 A | * | 8/2011 |
| JP | 2011162642 A | | 8/2011 |
| JP | 2014033193 A | | 2/2014 |
| WO | 2006011655 A1 | | 2/2006 |
| WO | 2009142290 A1 | | 11/2009 |

OTHER PUBLICATIONS

Oct. 7, 2019, the Extended European Search Report issued by the European Patent Office in the corresponding European Patent Application No. 17756396.2.

* cited by examiner

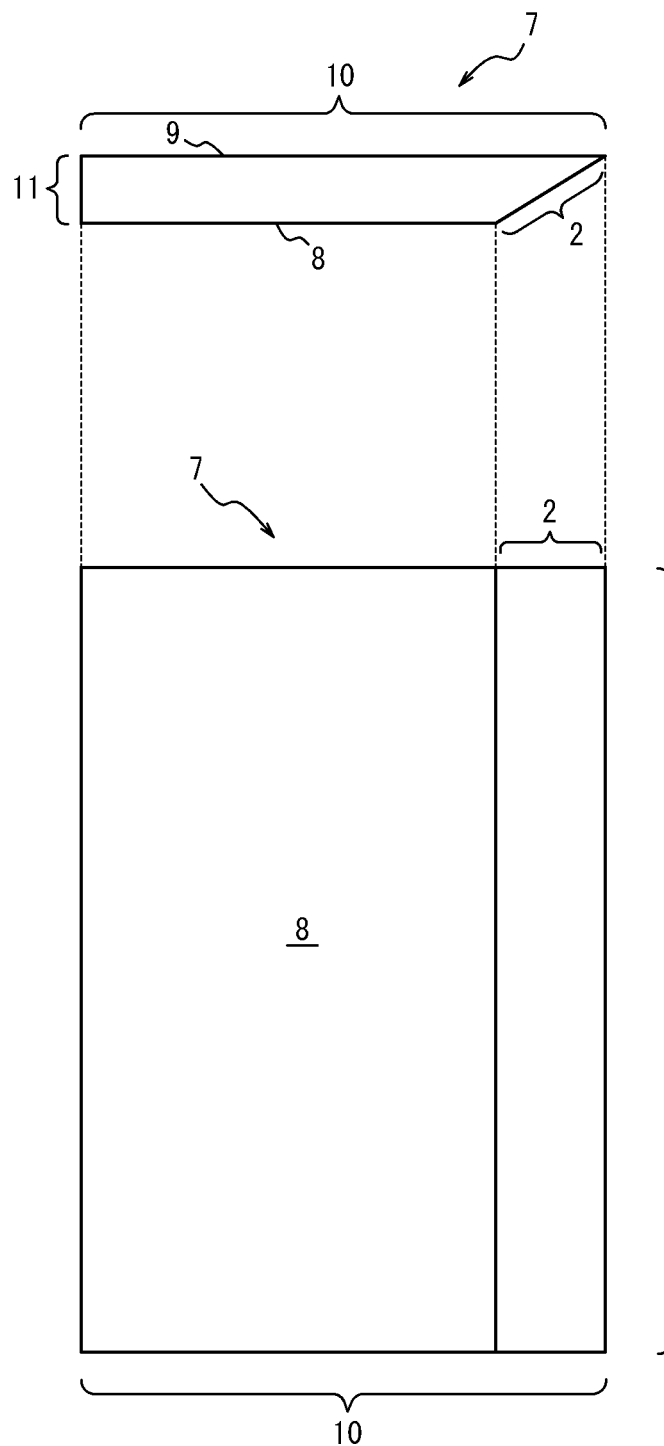

HEAT CONDUCTIVE SHEET AND METHOD OF PRODUCING SAME, AND HEAT DISSIPATION DEVICE

TECHNICAL FIELD

The present disclosure relates to a heat conductive sheet and a method of producing the same, and a heat dissipation device.

BACKGROUND

In recent years, electronic parts such as plasma display panels (PDPs) and integrated circuit (IC) chips generate more heat along with their increasing performance. This has led to the necessity of taking measures to prevent function failure due to temperature rises in the electronic parts of electronic devices.

General measures to prevent function failure due to temperature rise in an electronic part involve attaching a heat radiator such as a metallic heat sink, a radiation plate or a radiation fin to a heat source such as an electronic part to facilitate heat dissipation. When a heat radiator is used, the heat radiator and the heat source are closely attached to each other via a sheet member having high heat conductivity (heat conductive sheet) under a certain pressure in order to efficiently transfer heat from the heat source to the heat radiator. As the heat conductive sheet, a sheet molded using a composite material sheet having excellent heat conductivity is used. Such heat conductive sheets sandwiched between a heat source and a heat radiator during use are required to have high flexibility, as well as high heat conductivity. In order to improve the heat conductivity of the heat conductive sheet, it is necessary to lower the thermal resistance of the heat conductive sheet. The thermal resistance of the heat conductive sheet, when sandwiched between the heat generator and the heat sink, is considered to be the sum of the bulk thermal resistance, which is the thermal resistance of the heat conductive sheet itself, and the interfacial thermal resistance at the interface between the heat source and the heat radiator and the heat conductive sheet.

It is known that the thermal resistance of the material itself, that is, the bulk thermal resistance is expressed in relation to the thickness and heat conductivity of the material as:

bulk thermal resistance($m^2 \cdot K/W$)=thickness of material(m)/heat conductivity of material($W/m \cdot K$).

From this relational expression, in order to reduce the thermal resistance of the heat conductive sheet itself, that is, the bulk thermal resistance of the heat conductive sheet, it is necessary to reduce the thickness of the heat conductive sheet and to improve the heat conductivity of the heat conductive sheet. On the other hand, the interfacial thermal resistance of the heat conductive sheet is known to increase or decrease depending on the adhesion (interfacial adhesion) at the interface with the heat source and the heat radiator, the difference in bulk thermal resistance between the heat source and the heat conductive sheet, and the difference in bulk thermal resistance between the heat radiator and the heat conductive sheet. In particular, the interfacial adhesion can be affected by the pressure applied to the heat conductive sheet, the hardness (flexibility) of the heat conductive sheet, and the like. Therefore, in order to reduce the interface thermal resistance of the heat conductive sheet, it has been generally considered to increase the interfacial adhesion by giving a tack on the surface of the heat conductive sheet or decreasing the hardness of the heat conductive sheet.

For example, in WO2009/142290 (PTL 1), a primary sheet is formed from a composition containing a thermoplastic rubber, a thermosetting rubber, a thermosetting rubber curing agent, and an anisotropic graphite powder, and such primary sheets are stacked on top of each other to form a laminate, which in turn is sliced in the vertical direction to obtain a heat conductive sheet having a low thermal resistance of $0.04°$ C./W under a pressure of 0.5 MPa with graphite aligned in the vertical direction. In the heat conducting sheet, when forming a primary sheet from the composition, heat treatment is performed such that a thermosetting rubber is crosslinked with a thermosetting rubber curing agent and the thermosetting rubber crosslinked with the thermoplastic rubber coexist, thereby improving strength and flexibility.

For example, JP2014033193A (PTL 2) describes a heat conductive sheet containing a resin and a fibrous carbon fiber. By preventing 45 to 95% of the entire fibrous carbon fibers contained from being oriented in the thickness direction of the heat conductive sheet, the heat conductive sheet achieved a thermal resistance of $0.35°$ C./W under a pressure of 0.1 MPa.

For example, JP2006137930A (PTL 3) describes a heat conductive silicone grease composition containing a silicone oil and a copper powder having a low oxygen content. In the heat conductive silicone grease composition, the coarse particle mass is decreased by using a copper powder having a small average particle diameter and the coating thickness is made thin, whereby a sufficiently low thermal resistance of $0.036°$ C./W is achieved under a pressure of 0.15 MPa.

CITATION LIST

Patent Literature

PTL 1:WO2009/142290
PTL 2:JP2014033193A
PTL 3: JP2006137930A

SUMMARY

Technical Problem

However, the heat conductive sheet of PTL 1 has good heat conductivity only under a high pressure of 0.5 MPa, and the heat conductivity is greatly lowered under a pressure as low as 0.1 MPa. In addition, this heat conductive sheet is more tacky than necessary for lowering the interfacial thermal resistance, and is inferior in workability and peelability at the time of attachment and replacement, and sheet components remains in the frame of the heat dissipation device at the time of replacement.

In addition, in the heat conductive sheet of PTL 2, although the thermal resistance is the lowest at a relatively low pressure of 0.1 MPa, the thermal resistance value of $0.35°$ C./W itself under such pressure is high, and it cannot be said that it has excellent heat conductivity or heat dissipation characteristics.

Further, the heat conductive silicone grease composition of PTL 3 can exhibit good heat conductivity in a relatively low pressure region of 0.15 MPa, but because it is not a sheet but a grease, it is very poor in peelability and is inferior in reworkability, such as difficulty in replacement. That is, there has been no heat conductive sheet excellent in handleability and heat conductivity under relatively low pressure.

It would thus be helpful to provide a heat conductive sheet that is excellent in handleability and in heat conductivity under relatively low pressure. As used herein, "excellent in handleability" means hardness and tackiness being well balanced and excellent workability being obtained at the time of attachment and replacement, and "relatively low pressure" means 0.1 MPa or less.

It would also be helpful to provide a heat dissipation device having excellent heat dissipation characteristics under relatively low pressure.

Solution to Problem

As a result of intensive studies conducted to address the above issues, it was discovered that a heat conductive sheet that is formed using a composition containing a resin and a particulate carbon material and that has a predetermined thermal resistance exhibits excellent heat conductivity under relatively low pressure and is excellent in handleability. Based on this discovery the present disclosure was completed.

That is, in order to advantageously solve the above issues, a heat conductive sheet according to the present disclosure comprises a resin and a particulate carbon material, and has a thermal resistance value under a pressure of 0.05 MPa of 0.20° C./W or less. Since the heat conductive sheet thus configured is excellent in balance between hardness and tackiness, it is excellent in handleability and can provide excellent heat conductivity and heat dissipation characteristics under relatively low pressure.

In the heat conductive sheet of the present disclosure, it is preferable that the heat conductive sheet has a thermal resistance value change rate when applied pressure is changed from 0.50 MPa to 0.05 MPa of +150.0% or less. In the case where the thermal resistance value change rate when applied pressure is changed from 0.50 MPa to 0.05 MPa is +150.0% or less, it is possible to improve the balance between hardness and tackiness and to improve handleability.

In the heat conductive sheet of the present disclosure, it is preferable that the heat conductive sheet has a tack measured by a probe tack test of preferably 1.40 N or less. When the tack measured by a probe tack test is 1.40 N or less, it is possible to provide good tackiness during use while exhibiting good peelability at the time of attachment and replacement, and to remove the heat conductive sheet from the attachment such as a heat source or a heat radiator without impairing the heat conductive sheet, that is, without leaving part or all of the heat conductive sheet components on the attachment.

In the disclosed heat conductive sheet, the particulate carbon material is contained in an amount of preferably 20 parts by mass or more per 100 parts by mass of the resin. When the particulate carbon material is contained in an amount of 20 parts by mass or more per 100 parts by mass of the resin, the handleability can be further improved and the thermal resistance can be lowered.

In the heat conductive sheet of the present disclosure, it is preferable that the resin is a thermoplastic resin, and it is more preferable that the thermoplastic resin is a thermoplastic resin that is liquid at ordinary temperature. When the resin is a thermoplastic resin, it is possible to further improve the balance between the hardness and the tackiness of the heat conductive sheet, and to further improve the handleability. In addition, when the thermoplastic resin is a thermoplastic resin that is liquid at ordinary temperature, the interfacial thermal resistance can be lowered by increasing the interfacial adhesion under relatively low pressure, and the heat conductivity (i.e., heat dissipation characteristics) of the heat conductive sheet can be improved.

A heat dissipation device according to the disclosure comprises the disclosed heat conductive sheet interposed between a heat source and a heat radiator. By interposing the disclosed heat conductive sheet which is excellent in handleability and excellent in heat conductivity under relatively low pressure between a heat source and a heat radiator, it is possible to provide excellent heat dissipation characteristics under relatively low pressure.

A method of producing a heat conductive sheet according to the present disclosure comprises: shaping a composition containing a resin and a particulate carbon material into a sheet by pressure application to provide a pre-heat conductive sheet; obtaining a laminate either by stacking a plurality of the pre-heat conductive sheets in a thickness direction or by folding or rolling the pre-heat conductive sheet; and slicing the laminate at an angle of 45° or less relative to the stacking direction to obtain a heat conductive sheet. In the heat conductive sheet thus obtained, the particulate carbon material is aligned in the thickness direction, and not only the heat conductivity in the thickness direction but also the conductivity can be enhanced.

Advantageous Effect

According to the present disclosure, it is possible to provide a heat conductive sheet that is excellent in handleability and excellent in heat conductivity under relatively low pressure. Further, according to the present disclosure, it is possible to provide a heat dissipation device having excellent heat dissipation characteristics under relatively low pressure.

BRIEF DESCRIPTION OF THE DRAWINGS

In the accompanying drawings:

FIG. 5A is a conceptual diagram of one of the embodiments of a blade usable in slicing of the laminate disclosed herein as viewed generally from the side, and FIG. 5B is a conceptual diagram of the blade as viewed generally from the front;

DETAILED DESCRIPTION

Figure 1:
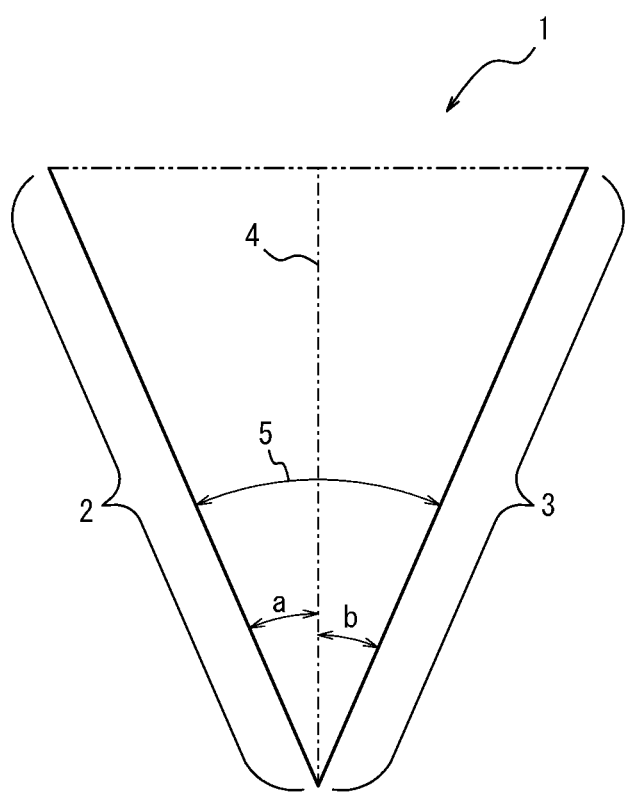
FIG. 1 is a conceptual diagram illustrating a cross section of a blade edge of one of the embodiments of a blade usable in slicing of the laminate disclosed herein.

Embodiments of the present disclosure will now be described in detail. For example, the heat conductive sheet of the present disclosure can be used in a manner such that it is sandwiched between a heat source and a heat radiator when the radiator is attached to the heat source. That is, the disclosed heat conductive sheet can constitute a heat dissipation device together with a heat source and a heat radiator such as a heat sink, a radiation plate, or a radiation fin. The disclosed heat conductive sheet can be produced, for example, by using the production method according to the disclosure.

(Heat Conductive Sheet)

It is preferable that the disclosed heat conductive sheet contains a resin and a particulate carbon material, and has a thermal resistance value under a pressure of 0.05 MPa of 0.20° C./W or less. When the heat conductive sheet does not contain the particulate carbon material, sufficient heat conductivity can not be obtained. Also, when the heat conductive sheet contains no resin, sufficient flexibility can not be obtained.

—Resin—

As used herein, the resin is not particularly limited, and any known resin usable for forming a heat conductive sheet can be used. Of these, preferred is a thermoplastic resin. The reason is that when a thermoplastic resin is used, the flexibility of the heat conductive sheet can be further improved in a high temperature environment during use (at the time of heat dissipation), and the heat source and the heat radiator can be brought into close contact with each other through the heat conductive sheet. Further, a thermosetting resin can be used in combination without impairing the properties and effects of the disclosed heat conductive sheet. As used herein, "resin" encompasses rubbers and elastomers.

—Thermoplastic Resins—

Examples of known thermoplastic resins that is usable for forming a heat conductive sheet include a thermoplastic resin that is solid at ordinary temperature and a thermoplastic resin that is liquid at ordinary temperature.

As the thermoplastic resin used in the disclosed heat conductive sheet, it is preferable to use a thermoplastic resin that is liquid at ordinary temperature. As used herein, "ordinary temperature" means 23° C. The use of a thermoplastic resin that is liquid at ordinary temperature can improve the interfacial adhesion to lower the interfacial thermal resistance under relatively low pressure, and can improve the heat conductivity of the heat conductive sheet (i.e., heat dissipation characteristics).

Examples of the thermoplastic resin that is liquid at ordinary temperature include acrylic resins, epoxy resins, silicone resins, and fluororesins. These thermoplastic resins may be used alone or in combination.

Further, a thermoplastic resin that is solid at ordinary temperature can be used in combination with a thermoplastic resin that is liquid at ordinary temperature. Examples of thermoplastic resins that are solid at ordinary temperature include: acrylic resins such as poly(2-ethylhexyl acrylate), copolymers of acrylic acid and 2-ethylhexyl acrylate, polymethacrylic acids or esters thereof, and polyacrylic acids or esters thereof; silicone resins; fluororesins; polyethylenes; polypropylenes; ethylene-propylene copolymers; polymethylpentenes; polyvinyl chlorides; polyvinylidene chlorides; polyvinyl acetates; ethylene-vinyl acetate copolymers; polyvinyl alcohols; polyacetals; polyethylene terephthalates; polybutylene terephthalates; polyethylene naphthalates; polystyrenes; polyacrylonitriles; styrene-acrylonitrile copolymers; acrylonitrile-butadiene-styrene copolymers (ABS resins); styrene-butadiene block copolymers or hydrogenated products thereof; styrene-isoprene block copolymers or hydrogenated products thereof; polyphenylene ethers; modified polyphenylene ethers; aliphatic polyamides; aromatic polyamides; polyamideimides; polycarbonates; polyphenylene sulfides; polysulfones; polyether sulfones; polyether nitriles; polyether ketones; polyketones; polyurethanes; liquid crystal polymers; and ionomers. These thermoplastic resins may be used alone or in combination.

—Thermoplastic Fluororesins—

The thermoplastic resin contained in the heat conductive sheet of the present disclosure preferably contains, and more preferably consists of, a thermoplastic fluororesin. The use of a thermoplastic fluororesin as the thermoplastic resin can improve the heat resistance, oil resistance, and chemical resistance. More preferably, the thermoplastic resin contained in the disclosed heat conductive sheet is a thermoplastic fluororesin that is liquid at ordinary temperature. By using a thermoplastic fluororesin that is liquid at ordinary temperature as the thermoplastic resin, in addition to improving the heat resistance, oil resistance, and chemical resistance, it is also possible to lower the interfacial thermal resistance by enhancing the interfacial adhesion even under relatively low pressure, and to improve the heat conductivity (i.e., heat dissipation characteristic) of the heat conductive sheet.

The thermoplastic fluororesin that is liquid at ordinary temperature is not particularly limited as long as it is a fluororesin that is in liquid form at ordinary temperature (23° C.). Examples thereof include vinylidene fluoride/hexafluoropropylene copolymers, vinylidene fluoride-hexafluoropentene-tetrafluoroethylene terpolymers, perfluoropropene oxide polymers, and tetrafluoroethylene-propylene-vinylidene fluoride copolymers. The thermoplastic fluororesin that is liquid at ordinary temperature may be a commercially available product, including, for example, Viton® LM (produced by Du Pont; Viton is a registered trademark in Japan, other countries, or both), Daiel® G101 (produced by Daikin Industries, Ltd.; Daiel is a registered trademark in Japan, other countries, or both), Dyneon FC 2210 (produced by 3M Company), and SIFEL series (produced by Shin-Etsu Chemicals, Co., Ltd.).

The viscosity of the thermoplastic fluororesin that is liquid at ordinary temperature is not particularly limited, yet from the viewpoint of good kneadability, flowability, and crosslinking reactivity and excellent formability, the viscosity at 105° C. is preferably 500 to 30,000 cps, and more preferably 550 to 25,000 cps.

Further, a thermoplastic fluororesin that is solid at ordinary temperature can be used in combination with a thermoplastic fluororesin that is liquid at ordinary temperature. Examples of the thermoplastic fluororesin that is solid at ordinary temperature include elastomers obtained by polymerizing fluorine-containing monomers, such as vinylidene fluoride-based, tetrafluoroethylene-propylene-based, and tetrafluoroethylene-perfluorovinyl ether-based ones. More specific examples include polytetrafluoroethylene, tetrafluoroethylene-perfluoroalkyl vinyl ether copolymers, tetrafluoroethylene-hexafluoropropylene copolymers, tetrafluoroethylene-ethylene copolymers, polyvinylidene fluoride, polychlorotrifluoroethylene, ethylene-chlorofluoroethylene copolymers, tetrafluoroethylene-perfluorodioxole copolymers, polyvinyl fluoride, tetrafluoroethylene-propylene copolymers, vinylidene fluoride-tetrafluoroethylene-hexafluoropropylene copolymers, acrylic modified products of polytetrafluoroethylene, ester modified products of polytetrafluoroethylene, epoxy modified products of polytetrafluoroethylene, and silane-modified products of polytetrafluoroethylene. Of these, from the viewpoint of processability, it is preferable to use polytetrafluoroethylene, acrylic modified products of polytetrafluoroethylene, tetrafluoroethylene-perfluoroalkyl vinyl ether copolymers, vinylidene fluoride-tetrafluoroethylene-hexafluoropropylene copolymers.

—Thermosetting Resins—

Without impairing the properties and effects of the heat conductive sheet disclosed herein, examples of optional thermosetting resins include: natural rubbers; butadiene rubbers, isoprene rubbers, nitrile rubbers, hydrogenated nitrile rubbers; chloroprene rubbers; ethylene propylene rubbers; chlorinated polyethylenes; chlorosulfonated polyethylenes; butyl rubbers; halogenated butyl rubbers; polyisobutylene rubbers; epoxy resins; polyimide resins; bismaleimide resins; benzocyclobutene resins; phenol resins; unsaturated polyesters; diallyl phthalate resins; polyimide silicone resins; polyurethanes; thermosetting polyphenylene ethers; and thermosetting modified polyphenylene ethers. These thermosetting resins may be used alone or in combination.

—Particulate Carbon Material—

Examples of usable particulate carbon materials include, but are not limited to, graphite such as artificial graphite, flake graphite, flaked graphite, natural graphite, acid-treated graphite, expandable graphite, and expanded graphite; and carbon black. These particulate carbon materials may be used alone or in combination.

Of these, preferred is expanded graphite. The reason is that the use of expanded graphite can improve the heat conductivity of the heat conductive sheet.

—Expanded Graphite—

Expanded graphite which may be suitably used as the particulate carbon material can be obtained for example by thermal expansion of expandable graphite which has been obtained by chemical treatment of graphite such as flake graphite with sulfuric acid or the like, followed by micronization. Examples of expanded graphite include products available from Ito Graphite Co., Ltd. under the trade names EC1500, EC1000, EC500, EC300, EC100, and EC50.

—Properties of Particulate Carbon Material—

The particulate carbon material contained in the disclosed heat conductive sheet has an average particle diameter of preferably 0.1 µm or more, more preferably 1 µm or more, even more preferably 25 µm or more, but preferably 300 µm or less, more preferably 250 µm or less, and even more preferably 200 µm or less. When the average particle diameter of the particulate carbon material is within the above range, it is possible to improve handleability by further improving the balance between hardness and tackiness of the heat conductive sheet, and to improve the heat conductivity by further lowering the thermal resistance of the heat conductive sheet.

The aspect ratio (major axis/minor axis) of the particulate carbon material contained in the heat conductive sheet of the present disclosure is preferably 1 or more and 10 or less, and more preferably 1 or more and 5 or less.

The "average particle diameter" herein can be found by measuring maximum diameters (major diameters) for 50 randomly-selected particulate carbon materials observed in a thickness-direction cross-sectional scanning electron micrograph (SEM) of the heat conductive sheet, and calculating the number-average of the measured major axis lengths. The "aspect ratio" herein can be found by measuring maximum diameters (major diameters) and diameters in a direction perpendicular to the maximum diameters (minor diameters) for randomly-selected 50 particulate carbon materials observed in a thickness-direction cross-sectional scanning electron micrograph (SEM) of the heat conductive sheet, and calculating the average of ratios of the major diameter to the minor diameter (major diameter/minor diameter).

—Particulate Carbon Material Content—

The heat conductive sheet disclosed herein preferably contains the particulate carbon material in an amount of preferably 20 parts by mass or more, more preferably 30 parts by mass or more, and even more preferably 50 parts by mass or more, but preferably 150 parts by mass or less, more preferably 90 parts by mass or less, and even more preferably 80 parts by mass or less, per 100 parts by mass of the resin. If the content of the particulate carbon material in the heat conductive sheet is 20 parts by mass or more and 150 parts by mass or less per 100 parts by mass of the resin, it is possible to further improve the balance between the hardness and the tackiness of the heat conductive sheet and to further improve the handleability. In addition, if the content of the particulate carbon material is 20 parts by mass or more per 100 parts by mass of the resin, the heat conductivity of the heat conductive sheet can be improved. If the content of the particulate carbon material is 150 parts by mass or less per 100 parts by mass of the resin, it is possible to improve the tackiness of the heat conductive sheet and to sufficiently prevent dusting of the particulate carbon material.

—Fibrous Carbon Material—

The disclosed heat conductive sheet may optionally contain a fibrous carbon material. Examples of optionally usable fibrous carbon materials include carbon nanotubes, vapor grown carbon fibers, carbon fibers obtained by carbonization of organic fibers, and chopped products thereof. These fibrous carbon materials may be used alone or in combination.

When the fibrous carbon material is contained in the disclosed heat conductive sheet, the heat conductive sheet will have improved heat conductivity and dusting of the particulate carbon material can be prevented. A possible, but still uncertain reason that blending of the fibrous carbon material prevents dusting of the particulate carbon material would be that the fibrous carbon material forms a three-dimensional structure whereby separation of the particulate carbon material is prevented while increasing heat conductivity and strength.

Of these fibrous carbon materials described above, preferred are fibrous carbon nanostructures such as carbon nanotubes, with fibrous carbon nanostructures including carbon nanotubes being more preferred. The use of fibrous carbon nanostructures such as carbon nanotubes allows for further increases in the heat conductivity and strength of the disclosed heat conductive sheet.

—Fibrous Carbon Nanostructures Including Carbon Nanotubes—

The fibrous carbon nanostructures including carbon nanotubes, which may be suitably used as the fibrous carbon material, may be composed solely of carbon nanotubes (hereinafter occasionally referred to as "CNTs") or may be a mixture of CNTs and fibrous carbon nanostructures other than CNTs. Any type of CNTs may be used for the fibrous carbon nanostructures, such as, for example, single-walled carbon nanotubes and/or multi-walled carbon nanotubes, with single- to up to 5-walled carbon nanotubes being preferred, and single-walled carbon nanotubes being more preferred. The use of single-walled carbon nanotubes will further improve, as compared to the use of multi-walled carbon nanotubes, the heat conductivity and strength of the disclosed heat conductive sheet.

In addition, the fibrous carbon nanostructures including CNTs are carbon nanostructures for which a ratio ($3\sigma$/Av) of a value obtained by multiplying the standard deviation ($\sigma$) of the diameters by three ($3\sigma$) to the average diameter (Av) is preferably greater than 0.20 and less than 0.60, more preferably greater than 0.25, and further preferably greater than 0.50. By using fibrous carbon nanostructures including CNTs for which $3\sigma$/Av is greater than 0.20 and less than 0.60, the heat conductivity and strength of the disclosed heat conductive sheet can be increased sufficiently even if the blending amount of carbon nanostructures is small. Accordingly, blending the fibrous carbon nanostructures including CNTs may suppress increase in the hardness (i.e., decrease in the flexibility) of the disclosed heat conductive sheet, making it possible to maintain both the heat conductivity and flexibility of the disclosed heat conductive sheet at a sufficiently high level.

As used herein, the "average diameter of fibrous carbon nanostructures (Av)" and the "standard deviation of diameters of fibrous carbon nanostructures ($\sigma$: sample standard deviation)" can each be obtained by measuring the diameters (external diameters) of 100 randomly selected carbon nanostructures using a transmission electron microscope. The standard deviation ($\sigma$) may be adjusted by changing the production method and the production conditions of fibrous carbon nanostructures including CNTs, or may be adjusted by combining different types of fibrous carbon nanostructures including CNTs obtained by different production methods.

The carbon nanostructures including CNTs that are used typically take a normal distribution when a plot is made of diameter measured as described above on a horizontal axis and frequency on a vertical axis, and a Gaussian approximation is made.

Furthermore, the fibrous carbon nanostructures including CNTs preferably exhibit a radial breathing mode (RBM) peak when evaluated by Raman spectroscopy. Raman spectra of fibrous carbon nanostructures composed solely of three or more multi-walled carbon nanotubes have no RBM.

Moreover, in a Raman spectrum of the fibrous carbon nanostructures including CNTs, a ratio (G/D ratio) of G band peak intensity relative to D band peak intensity is preferably at least 1 and no greater than 20. If the G/D ratio is at least 1 and no greater than 20, the heat conductivity and strength of the disclosed heat conductive sheet can be increased sufficiently even if the blending amount of fibrous carbon nanostructures is small. It is thus possible to suppress increase in the hardness (i.e., decrease in the flexibility) of the heat conductive sheet due to the blending of the fibrous carbon nanostructures, and to maintain both the heat conductivity and flexibility of the disclosed heat conductive sheet at a sufficiently high level.

The average diameter (Av) of the fibrous carbon nanostructures including CNTs is preferably at least 0.5 nm, and more preferably at least 1 nm, and is preferably no greater than 15 nm, and more preferably no greater than 10 nm. When the average diameter (Av) of the fibrous carbon nanostructures is at least 0.5 nm, aggregation of the fibrous carbon nanostructures can be suppressed to increase the dispersibility of the carbon nanostructures. Further, when the average diameter (Av) of the fibrous carbon nanostructures is no greater than 15 nm, the heat conductivity and strength of the disclosed heat conductive sheet can be sufficiently increased.

The average length of the fibrous carbon nanostructures including CNTs at the time of synthesis is preferably at least 100 μm and no greater than 5,000 μm. CNTs that have a longer structure length at the time of synthesis tend to be more easily damaged by breaking, severing, or the like during dispersing. Therefore, it is preferable that the average length of the structure at the time of synthesis is no greater than 5,000 μm.

Moreover, the fibrous carbon nanostructures including CNTs preferably have a BET specific surface area of 600 $m^2$/g or more, and more preferably 800 $m^2$/g or more, but preferably 2,500 $m^2$/g or less, and more preferably 1,200 $m^2$/g or less. Furthermore, the BET specific surface area is preferably at least 1,300 $m^2$/g in a situation in which the CNTs in the fibrous carbon nanostructures are mainly open CNTs. When the BET specific surface area of the fibrous carbon nanostructures including CNTs is at least 600 $m^2$/g, the heat conductivity and strength of the disclosed heat conductive sheet can be sufficiently increased. When the BET specific surface area of the carbon nanostructures including CNTs is no greater than 2,500 $m^2$/g, aggregation of the fibrous carbon nanostructures can be suppressed to increase the dispersibility of the CNTs in the disclosed heat conductive sheet. As used herein, "BET specific surface area" refers to a nitrogen adsorption specific surface area measured by the BET method.

According to a super growth method described below, the fibrous carbon nanostructures including CNTs are obtained as an aggregate that is aligned in a perpendicular direction (aligned aggregate) on a substrate having a catalyst layer for carbon nanotube growth on the surface thereof. The mass density of the fibrous carbon nanostructures in the form of the aforementioned aggregate is preferably at least 0.002 $g/cm^3$ and no greater than 0.2 $g/cm^3$. When the mass density is 0.2 $g/cm^3$ or less, the binding between fibrous carbon nanostructures becomes weak such that the fibrous carbon nanostructures can be homogeneously dispersed in the heat conductive sheet. Moreover, a mass density of at least 0.002 $g/cm^3$ makes the fibrous carbon nanostructures easier to handle by improving the unity of the fibrous carbon nanostructures and preventing them from becoming unbound.

Fibrous carbon nanostructures including CNTs having the properties described above can, for example, be produced efficiently in accordance with a method (super growth method; refer to WO2006011655A1) in which, in synthesis of CNTs through chemical vapor deposition (CVD) by supplying a feedstock compound and a carrier gas onto a substrate having a catalyst layer for carbon nanotube production on the surface thereof, catalytic activity of the catalyst layer is dramatically improved by providing a trace amount of an oxidant (catalyst activating material) in the system. Hereinafter, carbon nanotubes obtained by the super growth method may also be referred to as "SGCNTs."

The fibrous carbon nanostructures including CNTs produced by the super growth method may be composed solely of SGCNTs or may include, in addition to SGCNTs, other carbon nanostructures such as non-cylindrical carbon nanostructures.

—Properties of Fibrous Carbon Material—

The fibrous carbon material which may be included in the heat conductive sheet preferably has an average fiber diameter of 1 nm or more, preferably 3 nm or more, but preferably 2 μm or less, more preferably 1 μm or less. When the average fiber diameter of the fibrous carbon material falls within this range, it is possible to maintain the heat conductivity, flexibility, and strength of the disclosed heat conductive sheet simultaneously at a sufficiently high level. The aspect ratio of the fibrous carbon material preferably exceeds 10.

The "average fiber diameter" herein can be found by measuring fiber diameters for 50 randomly-selected fibrous carbon materials observed in a vertical (thickness direction) cross-sectional scanning electron micrograph (SEM) or transmission electron micrograph (TEM) of the heat conductive sheet, and calculating the number-average of the measured fiber diameters. In particular, for smaller fiber diameters, it is suitable to observe a similar cross section with a transmission electron microscope (TEM).

—Fibrous Carbon Material Content—

The disclosed heat conductive sheet preferably contains the fibrous carbon material in an amount of 0.05% by mass or more, and more preferably 0.2% by mass or more, but preferably 5% by mass or less, and more preferably 3% by mass or less. When the heat conductive sheet contains the fibrous carbon material in an amount of 0.05% by mass or more, it is possible to sufficiently increase the heat conductivity and strength of the heat conductive sheet, as well as to sufficiently prevent dusting of the particulate carbon material.

Further, when the content of the fibrous carbon material in the heat conductive sheet is 5% by mass or less, it is possible to suppress increase in the hardness (i.e., decrease in the flexibility) of the heat conductive sheet due to the blending of the fibrous carbon material, and to maintain both the heat conductivity and flexibility of the disclosed heat conductive sheet at a sufficiently high level.

—Additives—

Optionally, known additives that can be used for forming the heat conductive sheet can be blended in the disclosed heat conductive sheet. Any additive may be blended into the heat conductive sheet. Examples of additives include plasticizers such as fatty acid esters; flame retardants such as red phosphorus flame retardants and phosphate flame retardants; toughness improvers such as urethane acrylates; moisture absorbents such as calcium oxide and magnesium oxide; adhesion improvers such as silane coupling agents, titanium coupling agents, and acid anhydrides; wettability improvers such as nonionic surfactants and fluorine surfactants; and ion trapping agents such as inorganic ion exchangers.

—Properties of Heat Conductive Sheet—

The disclosed heat conductive sheet is not particularly limited, and preferably has the following properties.

—Thermal Resistance of Heat Conductive Sheet—

The disclosed heat conductive sheet has a thermal resistance value under a pressure of 0.05 MPa of preferably 0.20° C./W or less, preferably 0.19° C./W or less, and more preferably 0.17° C./W or less. When the thermal resistance value under a pressure of 0.05 MPa is 0.20° C./W or less, it is possible to provide excellent heat conductivity in the use environment under relatively low pressure.

Here, the thermal resistance value can be measured with a known measurement method usually used for measuring the thermal resistance of the heat conductive sheet, e.g., using a resin material thermal resistance tester (e.g., "C47108", trade name, produced by Hitachi Technologies and Services, Ltd.).

In addition, the disclosed heat conductive sheet preferably has a thermal resistance value change rate when applied pressure is changed from 0.50 MPa to 0.05 MPa of preferably +150.0% or less, more preferably +120.0% or less, and even more preferably +115.0% or less. In the case where the thermal resistance value change rate when applied pressure is changed from 0.50 MPa to 0.05 MPa is +150.0% or less, the amount of increase in the thermal resistance value accompanying the decrease in the applied pressure is small, and the hardness can be maintained at a certain level. Therefore, the balance between hardness and tackiness can be improved, and the handleability can be improved.

The thermal resistance value change rate when the applied pressure is lowered from 0.5 MPa to 0.05 MPa can be calculated by:

$$100\times([\text{thermal resistance value under a pressure of 0.05 MPa}]-[\text{thermal resistance value under a pressure of 0.5 MPa}])/\text{thermal resistance value under a pressure of 0.5 MPa}(\%).$$

—Tack of Heat Conductive Sheet—

The disclosed heat conductive sheet preferably has a tack measured by a probe tack test of preferably 1.40 N or less, more preferably 1.30 N or less, and even more preferably 1.20 N or less. "Tack" means a property of adhering to an adherend in a short time with a light force as defined in JIS Z0109:2015, which is also referred to herein as "adhesiveness". The tack of the disclosed heat conductive sheet is measured by a probe tack test. Specifically, the tack is measured as the force required to pull away a flat probe of φ10 mm from the the heat conductive sheet to be measured after the probe is pressed against the heat conductive sheet for 10 seconds under the temperature condition of 25° C. while applying a pressure of 0.5 N. When the tack measured by the probe tack test is 1.40 N or less, it is possible to provide excellent close adherence during use while exhibiting good peelability at the time of attachment and replacement, and to remove the heat conductive sheet from the attachment such as a heat source or a heat radiator without impairing the heat conductive sheet, that is, without leaving heat conductive sheet components on the attachment. In other words, the smaller the tack value measured by the probe tack test, the better the handleability. The tack of the disclosed heat conductive sheet can be measured with, e.g., a probe tack testing machine (e.g., "TAC 1000", trade name, produced by RHESCA Co., Ltd.).

—Hardness of Heat Conductive Sheet—

The disclosed heat conductive sheet has an Asker C hardness at 25° C. of 60 or more, preferably 65 or more, and more preferably 70 or more. When the Asker C hardness at 25° C. is 60 or more, appropriate hardness can be provided at ordinary temperature, and the workability at the time of attachment and replacement can be improved.

Also, the Asker C hardness at 25° C. of the disclosed heat conductive sheet is preferably 80 or less, and more preferably 70 or less. When the Asker C hardness at 25° C. is 80 or less, sufficient stickiness can be obtained in an ordinary temperature environment, and the workability at the time of attachment and replacement can be further improved.

The "Asker C hardness" can be measured at a predetermined temperature using a hardness tester according to the Asker C method specified in the Japan Rubber Association Standard (SRIS).

In addition, the disclosed heat conductive sheet has an Asker C hardness at 70° C. of preferably 55 or more, and more preferably 60 or more. When the Asker C hardness at 70° C. is 55 or more, sufficient hardness can be maintained even in a high temperature environment and sufficient peelability can be provided at the time of attachment and replacement such that replacement can be done without leaving heat conductive sheet components in the frame of the heat dissipation device.

Also, the Asker C hardness at 70° C. of the disclosed heat conductive sheet is preferably 70 or less, and more preferably 65 or less. When the Asker C hardness at 70° C. is 70 or less, interfacial adhesion can be further improved in a high temperature environment during use (at the time of dissipation), and heat conductivity can be further improved.

—Heat Conductivity of Heat Conductive Sheet—

The heat conductivity in the thickness direction of the heat conductive sheet is, at 25° C., preferably 20 W/m·K or more, more preferably 30 W/m·K or more, and further preferably 40 W/m·K or more. The heat conductivity of 20 W/m·k or more is high enough for the heat conductive sheet, when for example sandwiched between a heat source and a heat radiator, to efficiently transfer heat from the heat source to the heat radiator.

—Thickness of Heat Conductive Sheet—

The thickness of the heat conductive sheet is preferably from 0.05 mm (50 μm) to 10 mm. It is possible to reduce the bulk thermal resistance of the heat conductive sheet by reducing the thickness of the heat conductive sheet as long as the handleability is not impaired, and to improve the heat conductivity and the heat dissipation characteristics of the heat conductive sheet when used in a heat dissipation device.

—Density of Heat Conductive Sheet—

Further, the density of the disclosed heat conductive sheet is preferably 1.8 g/cm$^3$ or less, and more preferably 1.6 g/cm$^3$ or less. Such a heat conductive sheet has high versatility and can contribute to weight reduction of products such as electronic parts when mounted thereon.

<Heat Conductive Sheet Preparation Step>

—Pre-heat Conductive Sheet Shaping Step—

In this pre-heat conductive sheet shaping step, a composition containing a resin and a particulate carbon material, and optionally a fibrous carbon material and/or an additive, is shaped into a sheet by pressure application to provide a pre-heat conductive sheet.

—Composition—

The composition may be prepared by mixing a resin and a particulate carbon material with an optional fibrous carbon material and/or additive. The resin, carbon material, and additive can be the resin, particulate carbon material, fibrous carbon material, and additive mentioned above which may be included in the disclosed heat conductive sheet. It should be noted that when a cross-linked resin is used as the resin for the heat conductive sheet, a pre-heat conductive sheet may be formed using a composition containing a cross-linked resin, or may be formed using a composition containing a cross-linkable resin and a curing agent and, after the pre-heat conductive sheet shaping step, the cross-linkable resin may be cross-linked to introduce the cross-linked resin into the heat conductive sheet.

Mixing can be effected by any means, e.g., using a mixing device known in the art, such as kneader, roll, Henschel mixer, or Hobart mixer. Mixing may be effected in the presence of a solvent such as ethyl acetate. A resin may be previously dissolved or dispersed in the solvent to obtain a resin solution, and the solution may be mixed with another carbon material and an optional additive. The mixing time may be, for example, from 5 minutes to 6 hours. The mixing temperature may be, for example, from 5° C. to 150° C.

Of these components, because fibrous carbon material is easy to aggregate and is less dispersive, it is not easily dispersed well in the composition when mixed as it is with other components such as resin and expanded graphite. On the other hand, when fibrous carbon material is mixed with other components such as resin and expanded graphite in the form of a dispersion liquid dispersed in a solvent (dispersion medium), occurrence of aggregation can be suppressed. In this case, however, a large amount of solvent is used for, for example, coagulating the solid content after the mixing to obtain a composition, and there is a possibility that the amount of the solvent used for preparing the composition will increase. To avoid this, when a fibrous carbon material is to be blended in a composition used for forming a pre-heat conductive sheet, it is preferred that the fibrous carbon material is mixed with other components in the form of an aggregate (readily dispersible aggregate) which is obtained by removing the solvent from a dispersion liquid of the fibrous carbon material dispersed in solvent (dispersing medium). The aggregate of fibrous carbon material obtained by removing the solvent from a dispersion liquid of the fibrous carbon material is a highly readily dispersible aggregate because it is composed of a fibrous carbon material once dispersed in solvent and is more dispersible than an aggregate of the fibrous carbon material before dispersed into solvent. Thus, when such a readily dispersible aggregate is mixed with other components such as resin and expanded graphite, it is possible to allow the fibrous carbon material to be well dispersed in the composition efficiently without using large volumes of solvent.

Here, the dispersion liquid of the fibrous carbon material is obtained by, for example, subjecting a coarse dispersion liquid obtained by adding a fibrous carbon material to a solvent to a dispersion treatment that brings about a cavitation effect or a crushing effect. A dispersion treatment that brings about a cavitation effect utilizes shock waves caused by the rupture of vacuum bubbles formed in water when high energy is applied to the liquid. Specific examples of the dispersion treatment that brings about a cavitation effect include those using an ultrasonic homogenizer, a jet mill, and a high shear stirring device. In addition, the dispersion treatment that brings about a crushing effect is a dispersion method in which shearing force is applied to the coarse dispersion liquid to crush and disperse the aggregate of the fibrous carbon material, and by applying back pressure to the coarse dispersion liquid, fibrous carbon material is uniformly dispersed in a solvent while suppressing generation of bubbles. The dispersion treatment that brings about a crushing effect can be performed using a commercially available dispersion system (e.g., "BERYU SYSTEM PRO", trade name, produced by Beryu Corp.).

Removal of the solvent from the dispersion liquid can be carried out using a known solvent removal method such as drying or filtration, yet from the viewpoint of rapid and efficient removal of the solvent, filtration such as reduced pressure filtration is preferred.

—Formation of Composition—

Then, the composition thus prepared may be shaped into a sheet by pressure application optionally after degassing and crushing. When solvent has been used during mixing, it is preferred to remove the solvent before shaping the composition into a sheet. For example, when defoaming is performed under vacuum, solvent can be removed at the same time as defoaming.

Any method can be used for shaping of the composition as long as pressure is applied. The composition can be shaped into a sheet by shaping methods known in the art, such as pressing, rolling, or extruding. In particular, it is preferred that the composition is shaped into a sheet by rolling, more preferably by passing the composition between rolls with the composition sandwiched between protection films. Any protection film can be used, for example, sand-blasted polyethylene terephthalate films can be used. Roll temperature can be from 5° C. to 150° C.

—Pre-heat Conductive Sheet—

In the pre-heat conductive sheet obtained by shaping the composition into a sheet by pressure application, the carbon material is aligned mainly in the in-plane direction and this configuration is presumed to contribute to improved heat conductivity particularly in the in-plane direction. The thickness of the pre-heat conductive sheet is not particularly limited, and may be, for example, from 0.05 mm to 2 mm. From the viewpoint of further improving the heat conductivity of the heat conductive sheet, the thickness of the pre-heat conductive sheet is preferably more than 20 times but not more than 5000 times the average particle diameter of the particulate carbon material.

—Laminate Forming Step—

In the laminate forming step, a laminate is provided either by stacking a plurality of the pre-heat conductive sheet obtained in the pre-heat conductive sheet shaping step on top of each other or by folding or rolling the pre-heat conductive sheet. Formation of a laminate by folding of the pre-heat conductive sheet can be accomplished by any means, for example, a folding device can be used to fold the pre-heat conductive sheet at a constant width. Formation of a laminate by rolling of the pre-heat conductive sheet is not particularly limited, and may be performed by rolling the pre-heat conductive sheet around an axis parallel to the transverse or longitudinal direction of the pre-heat conductive sheet.

In the laminate obtained in the laminate forming step, generally, the adhesive force between the surfaces of the pre-heat conductive sheet(s) is sufficiently obtained by the pressure applied upon stacking, folding, or rolling of the pre-heat conductive sheet(s). However, in the case where the adhesive strength is insufficient or when it is necessary to sufficiently suppress the interlayer peeling of the laminate, the laminate forming step may be carried out in a state where the surfaces of the pre-heat conductive sheet(s) are slightly dissolved with a solvent, or in a state where an adhesive is applied to, or an adhesive layer is provided on, the surfaces of the pre-heat conductive sheet(s).

Any solvent can be used to dissolve the surfaces of the pre-heat conductive sheet(s), and any solvent known in the art capable of dissolving the resin component included in the pre-heat conductive sheet(s) can be used.

Any adhesive can be applied to the surfaces of the pre-heat conductive sheet(s), for example, a commercially available adhesive or tacky resin can be used. Of them, preferred adhesives are resins having the same composition as the resin component included in the pre-heat conductive sheet(s). The thickness of the adhesive applied to the surfaces of the pre-heat conductive sheet(s) can be, for example, from 10 μm to 1,000 μm.

Furthermore, any adhesive layer can be provided on the surfaces of the pre-heat conductive sheet(s), for example, a double-sided tape can be used.

From the viewpoint of preventing delamination, it is preferred that the obtained laminate is pressed in the stacking direction at a pressure of 0.05 MPa to 1.0 MPa at 20° C. to 100° C. for 1 minute to 30 minutes.

When the fibrous carbon material has been added to the composition or expanded graphite has been used as the particulate carbon material, in a laminate obtained by stacking, folding, or rolling pre-heat conductive sheet(s), it is presumed that the expanded graphite and the fibrous carbon material are aligned in a direction substantially perpendicular to the stacking direction.

—Slicing Step—

In the slicing step, the laminate obtained in the laminate forming step is sliced at an angle of 45° or less relative to the stacking direction to provide a heat conductive sheet formed of a sliced piece of the laminate. Any method can be used to slice the laminate, e.g., multi-blade method, laser processing method, water jet method, or knife processing method can be used, with the knife processing method being preferred because the thickness of the heat conductive sheet can be easily made uniform. Any cutting tool can be used to slice the laminate, e.g., a slicing member which has a smooth disk surface with a slit and a blade protruding from the slit (e.g., a plane or slicer equipped with a sharp blade) can be used.

Embodiments of a blade usable as the above-described blade will now be described in detail below with reference to the drawings.

Figure 2:
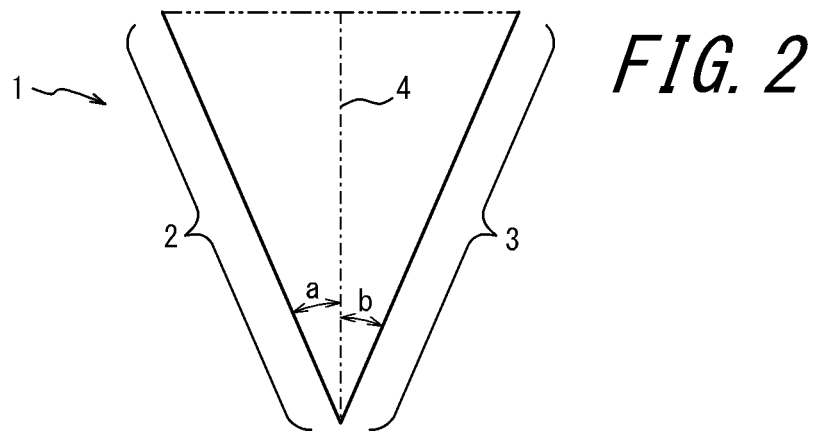
FIG. 2 is a conceptual diagram illustrating a cross section of a blade edge of a double-edged symmetrical blade, which is one of the embodiments of a blade usable in slicing of the laminate disclosed herein.
Figure 3:
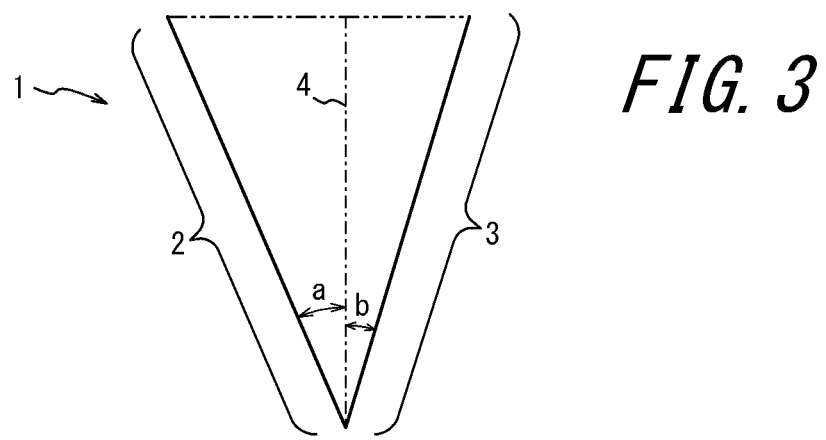
FIG. 3 is a conceptual diagram illustrating a cross section of a blade edge of a double-edged asymmetrical blade, which is one of the embodiments of a blade usable in slicing of the laminate disclosed herein.
Figure 4:
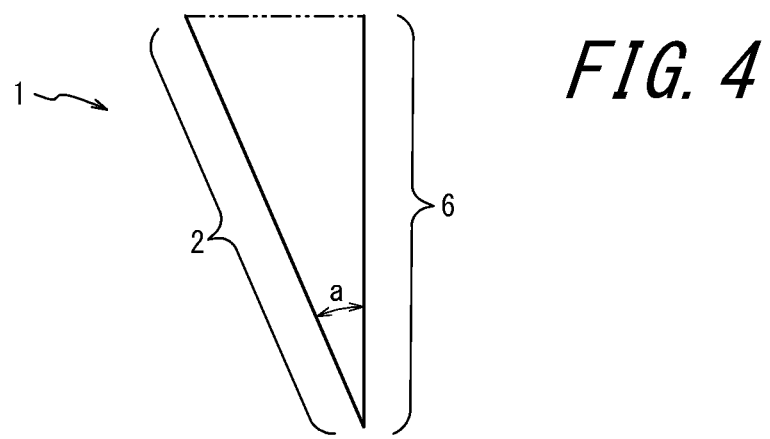
FIG. 4 is a conceptual diagram illustrating a cross section of a blade edge of a single-edged blade, which is one of the embodiments of a blade usable in slicing of the laminate disclosed herein.

A single blade having a blade portion may be "double-edged" in which both the front and back sides of the blade edge are cutting edges, or may be "single-edged" in which only the front side of the blade is a cutting edge. Referring to FIGS. 1 to 4 which are cross-sectional views of the blade edge 1, both edges are cutting edges 2 and 3 on both left and right sides in the case of a double-edged blade (FIGS. 1 to 3), and only one side of the left and right sides corresponding to the front side is a cutting edge 2 in the case of a single-edged blade (FIG. 4).

The cross-sectional shape of the blade edge 1 is not particularly limited, and may be asymmetric or symmetrical with respect to a central axis 4 passing through the extreme distal end of the blade edge 1. As used herein, a blade having a blade edge symmetrical in shape with respect to the central axis is referred to as a "symmetrical blade" (FIG. 2), while a blade having a blade edge asymmetrical in shape with respect to the central axis as an "asymmetrical blade" (FIG. 3). In each cross-sectional view of the blade edge, the angles formed by the right and left cutting edges with respect to the central axis are respectively referred to as "central angles", and the sum of the central angles is the angle of the blade edge (hereinafter also referred to as the "blade angle"). For example, in FIGS. 1 to 3 which are cross-sectional views of blade edges of double-edged blades, the angle formed by the cutting edge 2 on the left side with respect to the center axis 4 is a central angle a, and the angle formed by the cutting edge 3 on the right side with respect to the center axis 4 is a central angle b. The blade angle is preferably 60° or less. Although not particularly limited, the central angles a and b can preferably be selected such that the blade angle is 60° or less. For example, in the case of a double-edged symmetrical blade as illustrated in FIG. 2, when the central angles a and b on both sides are 20°, the blade angle is 40° which is the sum of a and b. In the case of a double-edged asymmetrical blade as illustrated in FIG. 3, the central angles a and b can be selected such that they are different from each other by more than 0°, preferably such that the sum of a and b (blade angle) is 60° or less. In the case of an asymmetrical blade as illustrated in FIG. 4, when the central angle a on one side is larger than 0° and the central angle b on the other side is 0°, the blade is a single-edged blade having one cutting edge 2 and one back edge 6.

Figure 6A:
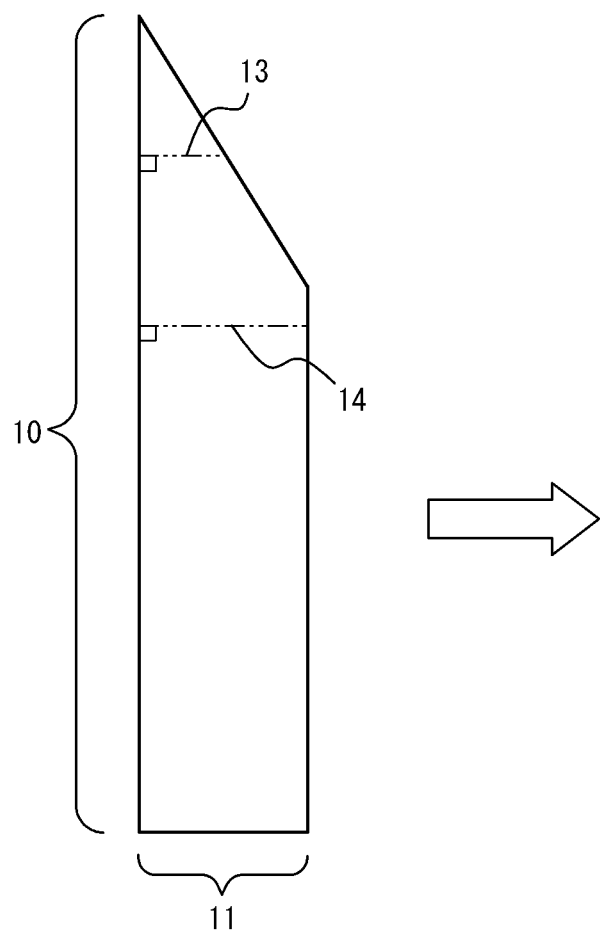
FIGS. 6A and 6B are conceptual diagrams for explaining how a central axis is defined in the case of a single-edged blade, which is one of the embodiments of a blade usable in slicing of the laminate disclosed herein.
Figure 6B:
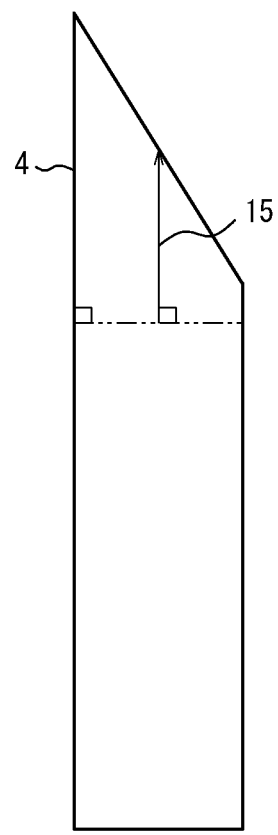
Figure 7A:
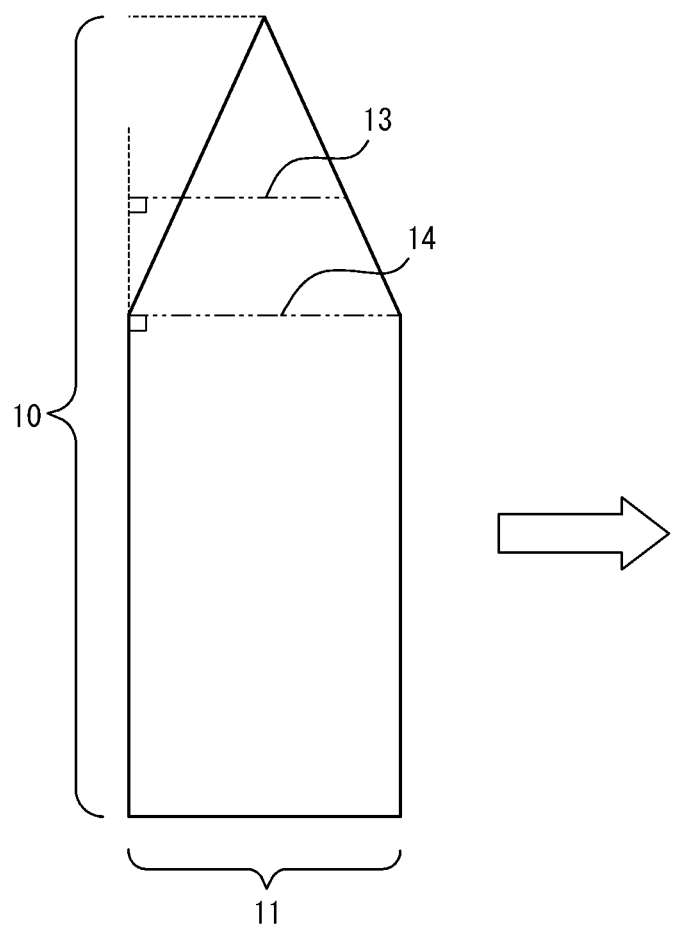
FIGS. 7A and 7B are conceptual diagrams for explaining how a central axis is defined in the case of a double-edged blade, which is one of the embodiments of a blade usable in slicing of the laminate disclosed herein.
Figure 7B:
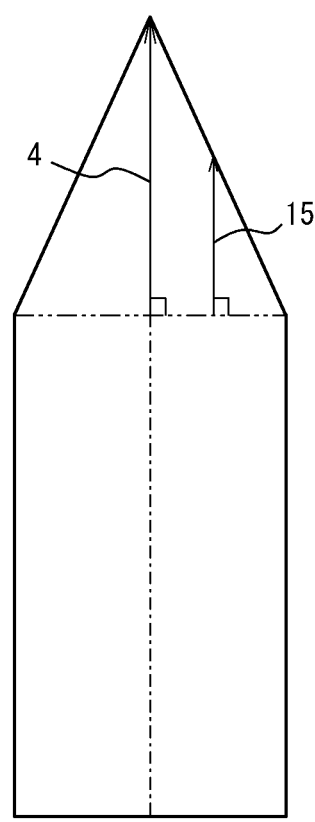

The central axis 4 is set as follows. In FIG. 5A in which the entire blade 7 is viewed from the side, the distance from the extreme distal end of the blade edge to the root of the blade is defined as "blade height" 10, and from a front side 8 to a back side 9 of the blade as "blade thickness" 11. FIG. 5B is a view of the entire blade 7 illustrated in FIG. 5A as viewed from the front side 8 of the blade. In FIGS. 6A-6B and 7A-7B in which the entire blade is seen from the side, in the cross section of the blade in a plane perpendicular to the blade height 10, one of perpendicular lines 13 drawn in a direction from the blade height 10 toward the blade thickness 11 that is the longest is defined as a "reference line" 14 (FIGS. 6A and 7A). Then, one of perpendicular lines 15 drawn in a direction from the reference line 14 toward the tip of the blade that is the longest and its extension are defined as the "central axis" 4 (FIGS. 6B and 7B). As described above, the central axis 4 passes through the extreme distal end of the blade edge.

Figure 8:
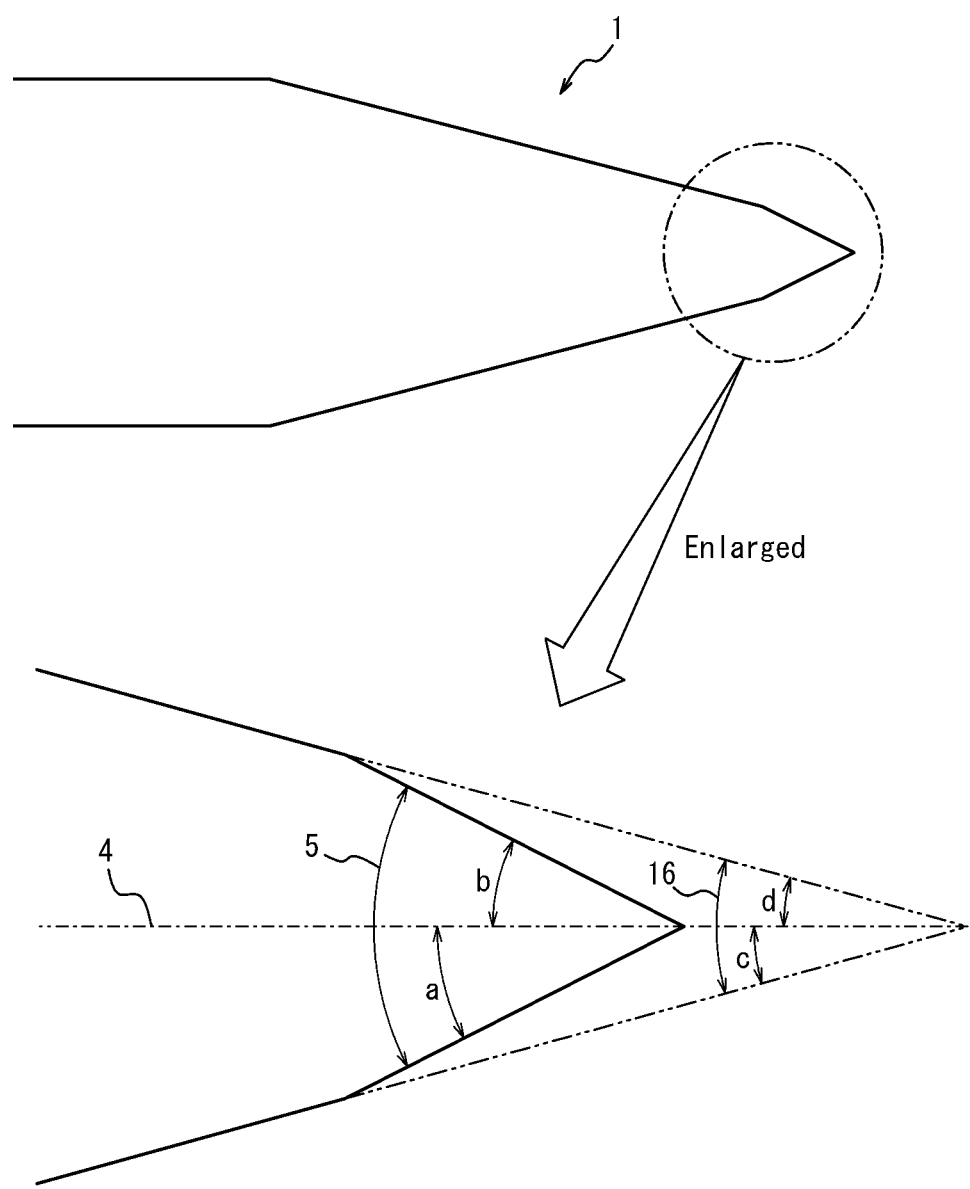
FIG. 8 is a conceptual diagram illustrating a cross section of a blade edge of a double-step blade, which is one of the embodiments of a blade usable in slicing of the laminate disclosed herein.

Further, the blade may be a single-step blade in which one cutting edge 2 or 3 has one face with respect to the central axis 4 of the blade as illustrated in FIGS. 1 to 7B, or may be a double-step blade in which one cutting edge 2 or 3 has two faces at different inclination angles with respect to the central axis 4 of the blade as illustrated in FIG. 8. In the case of a double-step blade, the sum of the central angles a and b forming the extreme distal end (second step) of the blade edge is the blade angle 5. As used herein, the blade angle of the double-step blade is referred to as a "blade angle $\alpha$" for the sake of convenience. Further, the central angles that are formed by the two-dot chain lines extending from the faces at the inclination angle on the root side (first step) of the blade edge toward the extreme distal end of the blade edge with respect to the center axis 4 of the blade are defined as c and d, and the blade angle 16 which is the sum of c and d is conveniently referred to as a "blade angle $\beta$". In the double-step blade, the blade angles $\alpha$ and $\beta$ are different from each other, and are preferably larger than 0° and not larger than 60° (0°<blade angle $\alpha$, blade angle $\beta \leq 60°$). Although not particularly limited, it is preferable that the blade angle $\alpha$ is larger than the blade angle $\beta$ (blade angle $\alpha$>blade angle $\beta$). The reason is that this setting provides a curling suppressing effect. On the other hand, when the blade angle $\alpha$ is smaller than the blade angle $\beta$ (blade angle $\alpha$<blade angle $\beta$), although the tip becomes sharp, there is a disadvantage that the blade is easily broken due to locally applied force. Therefore, the blade angle a and the blade angle $\beta$ preferably satisfy the relationship 0°<blade angle $\beta$<blade angle $\alpha \leq 60°$.

The number of blades constituting the blade portion is not particularly limited, and the blade portion may have, for example, a single-blade configuration composed of one blade or a double-blade configuration composed of two blades.

Figure 9A:
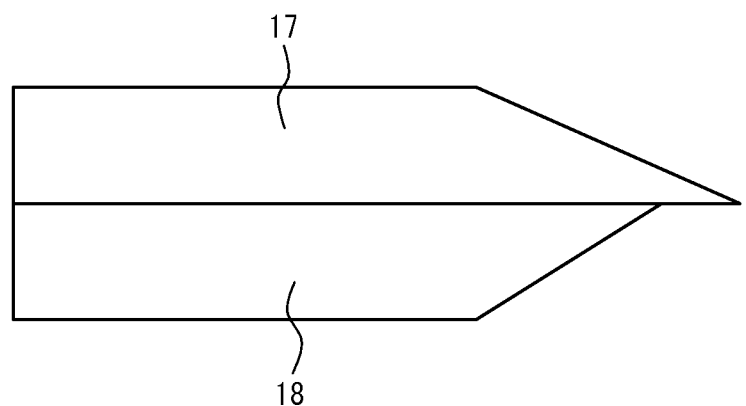
FIGS. 9A and 9B are each a conceptual diagram of one of the embodiments of a double-blade configuration usable in slicing of the laminate disclosed herein as viewed generally from the side.
Figure 9B:
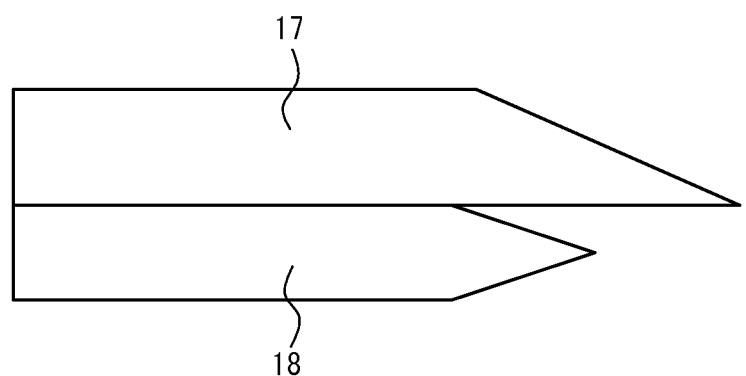

As illustrated in FIGS. 9A and 9B, a double-blade configuration is composed of one front blade 17 and one back blade 18, and the front and back blades 17 and 18 are arranged in contact with each other. At the time of cutting, one of the blades located on the side close to the object to be cut is the front blade 17 and the other far from the object is the back blade 18. As long as the front and back blades function as blades (that is, they have a cutting function), the extreme distal ends of the respective blade edges projecting from the slit portion may have the same or different heights (that is, they may be aligned or relatively shift.)

In addition, the two blades may be single- or double-edged, respectively. For example, both the front blade and the back blade may be single-edged (FIG. 9A), both the front blade and the back blade may be double-edged, or one of the front blade or the back blade may be single-edged and the other double-edged (FIG. 9B). In the case where one or both of the front blade and the back blade are single-edged, as long as the double-blade configuration functions as blades (that is, they have a cutting function), the side of one blade on which it comes into contact with the other blade is not limited to any of the cutting edge side (front side) or the back edge side (back side).

For example, FIG. 9A illustrates one embodiment of the double-blade configuration in which both the front blade 17 and the back blade 18 are single-edged, contact each other on the back edge side, and are arranged in an offset manner such that the extreme distal end of the edge of the back blade is positioned lower than (that is, below) the extreme distal end of the edge of the front blade. FIG. 9B illustrates another embodiment of the double-blade configuration in which the front blade 17 is single-edged and the back blade 18 is double-edged, the front blade is in contact with the back blade on the back edge side, and the extreme distal end of the edge of the back blade is positioned lower than (that is, below) the extreme distal end of the edge of the front blade.

In the case where one or both of the two blades are double-edged, the two blades may be symmetrical or asymmetrical blades.

Further, the two blades may be a single-step blade or a double-step blade, respectively.

In addition, the material of the blades is not particularly specified and may be metal, ceramic, or plastic, yet particularly from the viewpoint of resisting impact, cemented carbide is desirable. For the purpose of improving slipperiness and machinability, silicone, fluorine, and the like may be coated on the surface of the blade.

From the perspective of increasing the heat conductivity of the heat conductive sheet, the angle at which the laminate is sliced is preferably 30° or less relative to the stacking direction, more preferably 15° or less relative to the stacking direction, even more preferably substantially 0° relative to the stacking direction (i.e., along the stacking direction).

From the perspective of increasing the easiness of slicing, the temperature of the laminate at the time of slicing is preferably −20° C. to 40° C., more preferably 10° C. to 30° C. For the same reason, the laminate is preferably sliced while applying a pressure in a direction perpendicular to the stacking direction, more preferably while applying a pressure of 0.1 MPa to 0.5 MPa in a direction perpendicular to the stacking direction. It is presumed that the particulate carbon material and the fibrous carbon material are aligned in the thickness direction in the heat conductive sheet thus obtained. Thus, the heat conductive sheet prepared through the above steps has not only heat conductivity in thickness direction but also high electrical conductivity.

Alternatively, a plurality of heat conductive sheets prepared as described above may be stacked in the thickness direction and integrated by standing for a predetermined period of time, and the resultant may be used as the heat conductive sheet. It is presumed that the particulate carbon material and the fibrous carbon material are still aligned in the thickness direction in the heat conductive sheet thus obtained. Therefore, by overlapping a plurality of the heat conductive sheets prepared as described above with one another in the thickness direction to integrate them, it is possible to obtain a heat conductive sheet having a desired thickness according to the purpose of use without deteriorating the heat conductivity or electrical conductivity in the thickness direction.

(Application of Heat Conductive Sheet)

The heat conductive sheet produced using the disclosed method is excellent in heat conductivity, strength, and electrical conductivity. Accordingly, the composite material sheet and the heat conductive sheet can be suitably used as, e.g., a heat dissipation material, a heat dissipation component, a cooling component, a temperature control component, an electromagnetic wave shielding member, an electromagnetic wave absorbing member, or a rubber sheet for thermal pressure bonding to be interposed between the object to be bonded by pressure and a thermal pressure bonding device, used in various devices and apparatus.

As used herein, the various devices and apparatus are not particularly limited, and examples thereof include electronic devices such as servers, server personal computers, and desktop personal computers; portable electronic devices such as notebook computers, electronic dictionaries, PDAs, mobile phones, and portable music players; display devices such as liquid crystal displays (including backlights), plasma displays, LEDs, organic EL devices, inorganic EL devices, liquid crystal projectors, and watches; image forming devices such as inkjet printers (ink heads), electrophotographic devices (developing devices, fixing devices, heat rollers, and heat belts); semiconductor-related parts such as semiconductor devices, semiconductor packages, semiconductor sealing cases, semiconductor die bonding, CPUs, memory, power transistors, and power transistor cases; circuit boards such as rigid circuit boards, flexible circuit boards, ceramic circuit boards, build-up circuit boards, and multilayer circuit boards (circuit boards include printed circuit boards); manufacturing apparatus such as vacuum processing apparatus, semiconductor manufacturing apparatus, display device manufacturing apparatus; heat insulation devices such as heat insulation materials, vacuum heat insulation materials, and radiant heat insulating materials; data recording devices such as DVDs (optical pickups, laser generating devices, and laser light receiving devices) and hard disk drives; image recording devices such as cameras, video cameras, digital cameras, digital video cameras, microscopes, and CCDs; and battery devices such as charging devices, lithium ion batteries, and fuel cells.

(Heat Dissipation Device)

In the heat dissipation device according to the disclosure, the heat conductive sheet disclosed herein is interposed between a heat source and a heat radiator. The operating temperature of the heat dissipation device is preferably not higher than 250° C., and more preferably in the range of −20° C. to 200° C. When the use temperature exceeds 250° C., the flexibility of the resin component sharply decreases, and the heat dissipation characteristics may deteriorate in some cases. Examples of the heat source at this operating temperature include a semiconductor package, a display, an LED, and an electric lamp.

On the other hand, examples of the heat radiator include an aluminum or copper block connected to a heat sink or a heat pipe utilizing an aluminum or copper fin or plate, an aluminum or copper block in which cooling liquid circulates, and a Peltier element and an aluminum or copper block provided therewith.

The disclosed heat dissipation device can be obtained by interposing the disclosed heat conductive sheet between the heat source and the heat radiator and bringing the respective surfaces into contact with each other. There are no particular restrictions on the contacting method as long as the heat conductive sheet is interposed between the heat source and the heat radiator and they can be fixed in a state in which they are closely attached to each other sufficiently. From the viewpoint of maintaining close attachment, however, a way in which the pressing force is sustained is preferable, such as screwing via a spring, clipping with a clip, or the like.

In the disclosed heat dissipation device, the disclosed heat conductive sheet having excellent heat conductivity under relatively low pressure is interposed between the heat source and the heat radiator, and it is possible to provide excellent heat dissipation characteristics under an operating environment where a relatively low pressure is applied between the heat source and the heat radiator. Further, since the disclosed heat conductive sheet has both adequate hardness and tackiness and is excellent in handleability, the disclosed heat dissipation device is excellent in workability and durability in manufacturing, maintenance, repair, and so on.

EXAMPLES

In the following, this disclosure will be described with reference to Examples, which however shall not be construed as limiting by any means. In the following, "%" and "parts" used in expressing quantities are by mass, unless otherwise specified.

In Examples and Comparative Examples, the thermal resistance and reworkability of each heat conductive sheet were measured or evaluated respectively using the following methods.

(Evaluation Method)

<Thermal Resistance>

For measurement of the thermal resistance of each heat conductive sheet, a resin material thermal resistance tester ("C47108", trade name, produced by Hitachi Technologies and Services, Ltd.) was used. Each sample was cut into a size of 1 cm square and the thermal resistance was measured when a constant pressure was applied. The measurement was carried out such that the sample temperature was 50° C. The smaller the thermal resistance, the better the heat conductivity, and it indicates that the sample exhibits excellent heat dissipation characteristics when interposed between the heat source and the heat radiator to form a heat dissipation device.

The pressure to be applied was evaluated at two points of 0.05 MPa and 0.50 MPa. Further, the thermal resistance value change rate when the applied pressure was decreased from 0.5 MPa to 0.05 MPa was calculated as "thermal resistance change rate due to pressure drop (%)". The thermal resistance change rate due to pressure drop can be calculated by:

$$100\times([\text{thermal resistance value under a pressure of 0.05 MPa}]-[\text{thermal resistance value under a pressure of 0.5 MPa}])/\text{thermal resistance value under a pressure of 0.5 MPa}(\%).$$

As the applied pressure decreases, the thermal resistance value increases, and the smaller the thermal resistance change rate (increase rate) due to the pressure drop, the harder the heat conductive sheet is and the better handleability is obtained.

<Reworkability>

A sample (10 mm×10 mm) of a heat conductive sheet was attached to an aluminum plate, and a load was applied by reciprocating a 0.1 kg roll five times on the sample. Next, the sample was peeled off from the aluminum plate, and the state of the sample was evaluated. This test was repeated three times in the same procedure and evaluation was made as stated below. The results are listed in Table 1.

Excellent: In all of three repetitions, the sample was able to be peeled off without being torn off, and was reusable.
Good: In two of three repetitions, the sample was able to be peeled off without being torn off, and was reusable, but was torn off in one repetition.
Poor: In all of three repetitions, the sample was not reusable because it could not be peeled off.

<Tuck>

For measurement of the tack of each heat conductive sheet, a probe tack tester ("TAC 1000", trade name, produced by RHESCA Co., Ltd.) was used. The probe tip having a flat shape of φ10 mm was pressed against the resin sheet with a load of 0.5 N (50 gf) for 10 s, and the force required to separate the probe from the resin sheet was measured. The measurement temperature was 25° C. The smaller the tack measurement value, the lower the tackiness and the better handleability.

When it was too soft to be removed from the probe, it was evaluated as "unmeasurable".

(Preparation of Fibrous Carbon Nanostructures A including CNTs)

Fibrous carbon nanostructures A including SGCNTs were prepared by the super growth method in accordance with the teachings of WO 2006/011655. The fibrous carbon nanostructures A thus obtained had a G/D ratio of 3.0, a BET specific surface area of 800 m$^2$/g, and a mass density of 0.03 g/cm$^3$. As a result of measuring diameters for 100 randomly-selected fibrous carbon nanostructures A using a transmission electron microscope, it was found that the average diameter (Av) was 3.3 nm, a value obtained by multiplying the sample standard deviation of diameters (σ) by three (3σ) was 1.9 nm, the ratio (3σ/Av) was 0.58, and the average length was 100 μm. It was also revealed that the fibrous carbon nanostructures A thus obtained were mainly composed of single-walled CNTs (also referred to as "SGCNTs").

(Preparation of Readily Dispersible Aggregate of Fibrous Carbon Nanostructures A)

<Production of Dispersion Liquid>

Here, 400 mg of fibrous carbon nanostructures A as a fibrous carbon material was weighed out, mixed in 2 of methyl ethyl ketone as a solvent, and stirred for 2 minutes with a homogenizer to obtain a coarse dispersion liquid. Using a wet jet mill ("JN-20", trade name, produced by Jokoh Co., Ltd.), the resulting crude dispersion liquid was passed through a 0.5 mm flow path of the wet jet mill for 2 cycles at a pressure of 100 MPa, and the fibrous carbon nanostructures A were dispersed in methyl ethyl ketone. Then, a dispersion A having a solids concentration of 0.20% by mass was obtained. <Removal of Solvent>

Then, the resultant dispersion A was subjected to vacuum filtration using Kiriyama Filter Paper (No. 5A) to obtain a sheet-like readily dispersible aggregate.

Example 1

<Preparation of Composition>

Here, 0.1 parts by mass of a readily dispersible aggregate of fibrous carbon nanostructures A as a fibrous carbon material, 50 parts by mass of expanded graphite as an particulate carbon material ("EC-100", trade name, produced by Ito Graphite Co., Ltd., average particle diameter: 190 μm), and 100 parts by mass of a thermoplastic fluororesin that is liquid at ordinary temperature ("Daiel G-101", trade name, produced by Daikin Industries, Ltd.) as a resin were charged into a Hobart mixer ("Model ACM-5 LVT", trade name, produced by Kodaira Seisakusho Co., Ltd., capacity: 5 L), heated to 80° C., and mixed for 30 minutes.

The mixed composition was crushed for 1 minute with a Wonder Crush/Mill ("D3V-10", trade name, produced by Osaka Chemical Co., Ltd.).

<Preparation of Pre-Heat Conductive Sheet>

Then, 5 g of the crushed composition was sandwiched between sandblasted PET films (protective films) having a thickness of 50 μm and shaped by rolling under the conditions of a roll gap of 550 μm, a roll temperature of 50° C., a roll line pressure of 50 kg/cm, and a roll speed of 1 m/min, and as a result a pre-heat conductive sheet having a thickness of 0.5 mm was obtained.

<Preparation of Laminate>

The obtained pre-heat conductive sheet was cut into 6 cm×6 cm×0.5 mm pieces, 120 pieces were stacked in the thickness direction and pressed under a pressure of 0.1 MPa at 120° C. for 3 minutes, and a laminate having a thickness of about 6 cm was obtained.

<Preparation of Heat Conductive Sheet>

Then, using a wood working slicer ("Superfinishing Planer Super Mecha S", trade name, produced by Marunaka Tekkosho Inc.), a cross section of the laminate of pre-heat conductive sheet(s) was sliced at an angle of 0° relative to the stacking direction (in other words, sliced in the normal direction of the principal plane of the stacked pre-heat conductive sheet(s)) while pushing at a pressure of 0.3 MPa, and a heat conductive sheet of 6 cm long×6 cm wide×150 μm thick.

The knife of the wood working slicer used had a double-blade configuration in which two single-edged blades are in contact with each other on the opposite side (back edge) of the cutting edge and arranged in a manner that the extreme distal end of the edge of the front blade is positioned 0.5 mm higher than the extreme distal end of the edge of the back blade at a protruding distance of 0.11 mm from the slit portion, with an edge angle of the front blade being 21°. For each obtained heat conductive sheet, thermal resistance and tack were measured and reworkability was evaluated according to the above evaluation method. The results are listed in Table 1.

Example 2

A heat conductive sheet was produced and subjected to measurement for thermal resistance and tack and to evaluation for reworkability in the same manner as in Example 1 except that the thickness of the slice was 250 μm. The results are listed in Table 1.

Example 3

A heat conductive sheet was produced and subjected to measurement for thermal resistance and tack and to evaluation for reworkability in the same manner as in Example 1 except that the particulate carbon material was changed to 80 parts by mass of expanded graphite having an average particle diameter of 30 μm ("EC-500", trade name, produced by Ito Graphite Industries, Ltd.) and the thickness of the slice was 250 μm. The results are listed in Table 1.

Example 4

A heat conductive sheet was produced and subjected to measurement for thermal resistance and tack and to evaluation for reworkability in the same manner as in Example 1 except that a readily dispersible aggregate of carbon nanostructures A as the fibrous carbon material was not added and the thickness of the slice was 250 μm. The results are listed in Table 1.

Example 5

A heat conductive sheet was produced and subjected to measurement for thermal resistance and tack and to evaluation for reworkability in the same manner as in Example 1 except that the particulate carbon material was changed to a combination of 30 parts by mass of expanded graphite having an average particle diameter of 190 μm ("EC-100", trade name, produced by Ito Graphite Industry Co., Ltd.) and 20 parts by mass of expanded graphite having an average particle diameter of 30 um ("EC-500", trade name, produced by Ito Graphite Industry Co., Ltd.). The results are listed in Table 1.

Example 6

A heat conductive sheet was produced and subjected to measurement for thermal resistance and tack and to evaluation for reworkability in the same manner as in Example 1 except that the particulate carbon material was changed to 80 parts by mass of expanded graphite having an average particle diameter of 250 μm ("EC-50", trade name, produced by Ito Graphite Industry Co., Ltd.). The results are listed in Table 1.

Example 7

A heat conductive sheet was produced and subjected to measurement for thermal resistance and tack and to evaluation for reworkability in the same manner as in Example 1 except that the resin was changed to a combination of 90 parts by mass of a thermoplastic fluororesin that is liquid at ordinary temperature ("Daiel G-101", trade name, produced by Daikin Industries, Ltd.) and 10 parts by mass of a thermoplastic fluororesin that is solid at ordinary temperature ("Daiel G-912", trade name, produced by Daikin Industries, Ltd.). The results are listed in Table 1.

Example 8

A heat conductive sheet was produced and subjected to measurement for thermal resistance and tack and to evaluation for reworkability in the same manner as in Example 1 except that the content of the particulate carbon material was changed to 30 parts by mass and the thickness of the slice was 80 μm. The results are listed in Table 1.

Comparative Example 1

In this case, 80 parts by mass of expanded graphite ("EC-100", trade name, produced by Ito Graphite Co., Ltd., average particle diameter: 190 μm) as a particulate carbon material and 100 parts by mass of a thermoplastic fluororesin that is solid at ordinary temperature ("Daiel G-912", trade name, produced by Daikin Industries, Ltd.) as a resin were mixed under stirring for 5 minutes in a Hobart mixer ("Model ACM-5 LVT", trade name, produced by Kodaira Seisakusho Co., Ltd., capacity: 5 L) in the presence of 100 parts by mass of ethyl acetate as the solvent. The obtained mixture was vacuum defoamed for 30 minutes, and ethyl acetate was removed simultaneously with defoaming to obtain a composition. The resultant composition was crushed for 10 seconds in a crushing machine. In the subsequent procedure, a heat conductive sheet was produced and subjected to measurement for thermal resistance and tack and to evaluation for reworkability in the same manner as in Example 1 except that the thickness of the slice was 250 μm. The results are listed in Table 1.

Comparative Example 2

A heat conductive sheet was produced and subjected to measurement for thermal resistance and tack and to evaluation for reworkability in the same manner as in Example 1 except that the content of the particulate carbon material was changed to 10 parts by mass and the thickness of the slice was 80 μm. The results are listed in Table 1.

Comparative Example 3

A heat conductive sheet was produced and subjected to measurement for thermal resistance and tack and to evaluation for reworkability in the same manner as in Example 1 except that the particulate carbon material was changed to 50 parts by mass of artificial graphite ("AGB-055", trade name, produced by Ito Graphite Industries, Ltd., average particle diameter: 500 μm) and the thickness of the slice was 250 μm. The results are listed in Table 1.

Comparative Example 4

Measurement was carried out using a commercially available silicone grease ("G-751", trade name, produced by Shin-Etsu Chemicals, Co., Ltd.) as a heat conductive silicone composition in place of a heat conductive sheet. The results are listed in Table 1.

TABLE 1

| | | | Example 1 | Example 2 | Example 3 | Example 4 | Example 5 |
|---|---|---|---|---|---|---|---|
| Composition [parts by mass] - Production | Thermoplastic resin | Fluororesin G-101 | 100 | 100 | 100 | 100 | 100 |
| | | Fluororesin G-912 | — | — | — | — | — |
| | Plasticizer | Sebacic acid ester | — | — | 5 | — | — |
| | Particulate carbon material | EC-100 particle diameter: 190 μm | 50 | 50 | — | 50 | 30 |
| | | EC-500 particle diameter: 30 μm | — | — | 80 | — | 20 |
| | | EC-50 particle diameter: 250 μm | — | — | — | — | — |
| | | AGB-055 particle diameter: 500 μm | — | — | — | — | — |
| | Fibrous carbon material | Carbon nanostructures A | 0.1 | 0.1 | 0.1 | — | 0.1 |
| | Heat conductive sheet thickness [μm] | | 150 | 250 | 250 | 250 | 150 |

TABLE 1-continued

| Evaluation | Thermal resistance value [° C./W] | under pressure of 0.05 MPa | 0.15 | 0.17 | 0.15 | 0.19 | 0.15 |
|---|---|---|---|---|---|---|---|
| | | under pressure of 0.50 MPa | 0.07 | 0.08 | 0.06 | 0.10 | 0.08 |
| | Thermal resistance change rate due to pressure drop [%] | | +114.3 | +112.5 | +150.0 | +90.0 | +87.5 |
| | Reworkability | | Excellent | Excellent | Excellent | Good | Excellent |
| | Tack measured by a probe tack test [N] | | 1.2 | 1.2 | 0.7 | 1.2 | 1.0 |

| | | | Example 6 | Example 7 | Example 8 | Comparative Example 1 | Comparative Example 2 |
|---|---|---|---|---|---|---|---|
| Composition [parts by mass] - Production | Thermoplastic resin | Fluororesin G-101 | 100 | 90 | 100 | — | 100 |
| | | Fluororesin G-912 | — | 10 | — | 100 | — |
| | Plasticizer | Sebacic acid ester | — | — | — | — | — |
| | Particulate carbon material | EC-100 particle diameter: 190 μm | — | 50 | 30 | 80 | 10 |
| | | EC-500 particle diameter: 30 μm | — | — | — | — | — |
| | | EC-50 particle diameter: 250 μm | 80 | — | — | — | — |
| | | AGB-055 particle diameter: 500 μm | — | — | — | — | — |
| | Fibrous carbon material | Carbon nanostructures A | 0.1 | 0.1 | 0.1 | — | 0.1 |
| | Heat conductive sheet thickness [μm] | | 150 | 150 | 80 | 250 | 80 |
| Evaluation | Thermal resistance value [° C./W] | under pressure of 0.05 MPa | 0.19 | 0.19 | 0.19 | 0.67 | 0.26 |
| | | under pressure of 0.50 MPa | 0.13 | 0.10 | 0.13 | 0.13 | 0.22 |
| | Thermal resistance change rate due to pressure drop [%] | | +46.2 | +90.0 | +46.2 | +415.4 | +18.2 |
| | Reworkability | | Good | Excellent | Excellent | Good | Poor |
| | Tack measured by a probe tack test [N] | | 1.3 | 1.1 | 1.4 | 0.6 | 1.7 |

| | | | Comparative Example 3 | Comparative Example 4 |
|---|---|---|---|---|
| Composition [parts by mass] - Production | Thermoplastic resin | Fluororesin G-101 | 100 | Commercially available silicone grease Thermal conductivity 4.5 W/m · K |
| | | Fluororesin G-912 | — | |
| | Plasticizer | Sebacic acid ester | — | |
| | Particulate carbon material | EC-100 particle diameter: 190 μm | — | |
| | | EC-500 particle diameter: 30 μm | — | |
| | | EC-50 particle diameter: 250 μm | — | |
| | | AGB-055 particle diameter: 500 μm | 50 | |
| | Fibrous carbon material | Carbon nanostructures A | 0.1 | |
| | Heat conductive sheet thickness [μm] | | 250 | |
| Evaluation | Thermal resistance value [° C./W] | under pressure of 0.05 MPa | 0.93 | 0.19 |
| | | under pressure of 0.50 MPa | 0.52 | 0.16 |
| | Thermal resistance change rate due to pressure drop [%] | | +78.8 | +18.8 |
| | Reworkability | | Good | Poor |
| | Tack measured by a probe tack test [N] | | 1.4 | unmeasurable |

It can be seen from Table 1 that Examples 1 to 8 in which the resin and particulate carbon material were contained and the thermal resistance value under a pressure of 0.05 MPa was 0.20° C./W or less had excellent heat conductivity under a pressure of 0.05 MPa, excellent heat conductivity under a pressure of 0.50 MPa, and excellent reworkability in a well-balanced manner as compared with Comparative Examples 1 to 4.

INDUSTRIAL APPLICABILITY

Since the heat conductive sheet according to the present disclosure is excellent in handleability and excellent in heat conductivity under relatively low pressure, it can provide a heat dissipation device that is excellent in workability in manufacturing, maintenance, repair, and the like, that is excellent in durability, and that has excellent heat dissipation characteristics under the use environment under relatively low pressure. The method of producing a heat conductive sheet according to the present disclosure can provide a heat conductive sheet that is excellent in handleability and excellent in heat conductivity under relatively low pressure. Further, the heat dissipation device of the present disclosure can be suitably used under a use environment where a relatively low pressure is applied between the heating element and the heat dissipating element.

REFERENCE SIGNS LIST 1 blade edge
2 cutting edge
3 cutting edge
4 central axis
5 blade angle
6 back edge
7 entire blade
8 front
9 back
10 blade height
11 blade thickness
12 blade width
13 perpendicular line
14 reference line
15 perpendicular line
16 blade angle
17 front blade
18 back blade

The invention claimed is:

1. A heat conductive sheet comprising a resin, a fibrous carbon nanostructure and a particulate carbon material, and having a thermal resistance value under a pressure of 0.05 MPa of 0.15° C./W or more and 0.20° C./W or less,
wherein the resin is a thermoplastic fluororesin that is liquid at 23° C., and
the particulate carbon material comprises expanded graphite.

2. The heat conductive sheet according to claim 1, having a thermal resistance value change rate when applied pressure is changed from 0.50 MPa to 0.05 MPa of +150.0% or less.

3. The heat conductive sheet according to claim 1, having a tack measured by a probe tack test of 1.40 N or less.

4. The heat conductive sheet according to claim 1, wherein the particulate carbon material is contained in an amount of 20 parts by mass or more per 100 parts by mass of the resin.

5. A heat dissipation device comprising the heat conductive sheet as recited in claim 1 interposed between a heat source and a heat radiator.

* * * * *